(12) United States Patent
Gueltig

(10) Patent No.: US 9,324,530 B2
(45) Date of Patent: Apr. 26, 2016

(54) CIRCUIT FOR PROTECTING AGAINST REVERSE POLARITY

(75) Inventor: Michael Gueltig, Stutensee (DE)

(73) Assignee: INIT Innovative Informatikanwendungen in Transport-, Verkehrs- und Leitsystemen GmbH, Karlsruhe (DE)

( * ) Notice: Subject to any disclaimer, the term of this patent is extended or adjusted under 35 U.S.C. 154(b) by 196 days.

(21) Appl. No.: 13/883,746

(22) PCT Filed: Oct. 12, 2011

(86) PCT No.: PCT/DE2011/050046
§ 371 (c)(1),
(2), (4) Date: May 6, 2013

(87) PCT Pub. No.: WO2012/069045
PCT Pub. Date: May 31, 2012

(65) Prior Publication Data
US 2013/0229738 A1    Sep. 5, 2013

(30) Foreign Application Priority Data

Nov. 22, 2010   (DE) .......................... 10 2010 051 874

(51) Int. Cl.
| | |
|---|---|
| H01H 83/08 | (2006.01) |
| H02H 11/00 | (2006.01) |
| H02J 7/00 | (2006.01) |
| H03K 17/30 | (2006.01) |

(52) U.S. Cl.
CPC ............ *H01H 83/08* (2013.01); *H02H 11/003* (2013.01); *H02J 7/0034* (2013.01); *H03K 2017/307* (2013.01)

(58) Field of Classification Search
CPC ..... H02H 11/003; H01H 83/08; H02J 7/0034; H03K 2017/307

USPC ........................................................... 361/84
See application file for complete search history.

(56) References Cited

U.S. PATENT DOCUMENTS 5,434,739 A * 7/1995 Heck ............................... 361/84

FOREIGN PATENT DOCUMENTS

| DE | 19506074A1 | 9/1996 |
|---|---|---|
| DE | 19840300A1 | 3/2000 |

(Continued)

OTHER PUBLICATIONS

International Searching Authority, International Search Report (ISR) and Written Opinion for International Application No. PCT/DE2011/050046, Jul. 5, 2012, 10 pages, European Patent Office.

*Primary Examiner* — Thienvu Tran
*Assistant Examiner* — Kevin J Comber
(74) *Attorney, Agent, or Firm* — Alston & Bird LLP

(57) ABSTRACT

A circuit for protecting an electric load against reverse polarity is provided by using a MOSFET (metal oxide semiconductor field-effect transistor), wherein: the circuit is connected on the input side to a voltage supply and on the output side to the load; the source connection of the MOSFET is connected to the voltage supply; the drain connection of the MOSFET is connected to the load; the circuit has dynamic behavior similar to a diode and at the same time low power loss; the gate of the MOSFET is connected to the collector of a first bipolar transistor; the source of the MOSFET is connected to the emitter of the first bipolar transistor; the base of the first bipolar transistor is controlled by a control current; and the control current is derived from the voltage at the drain of the MOSFET.

9 Claims, 5 Drawing Sheets

(56) References Cited

U.S. PATENT DOCUMENTS

Figure 1:
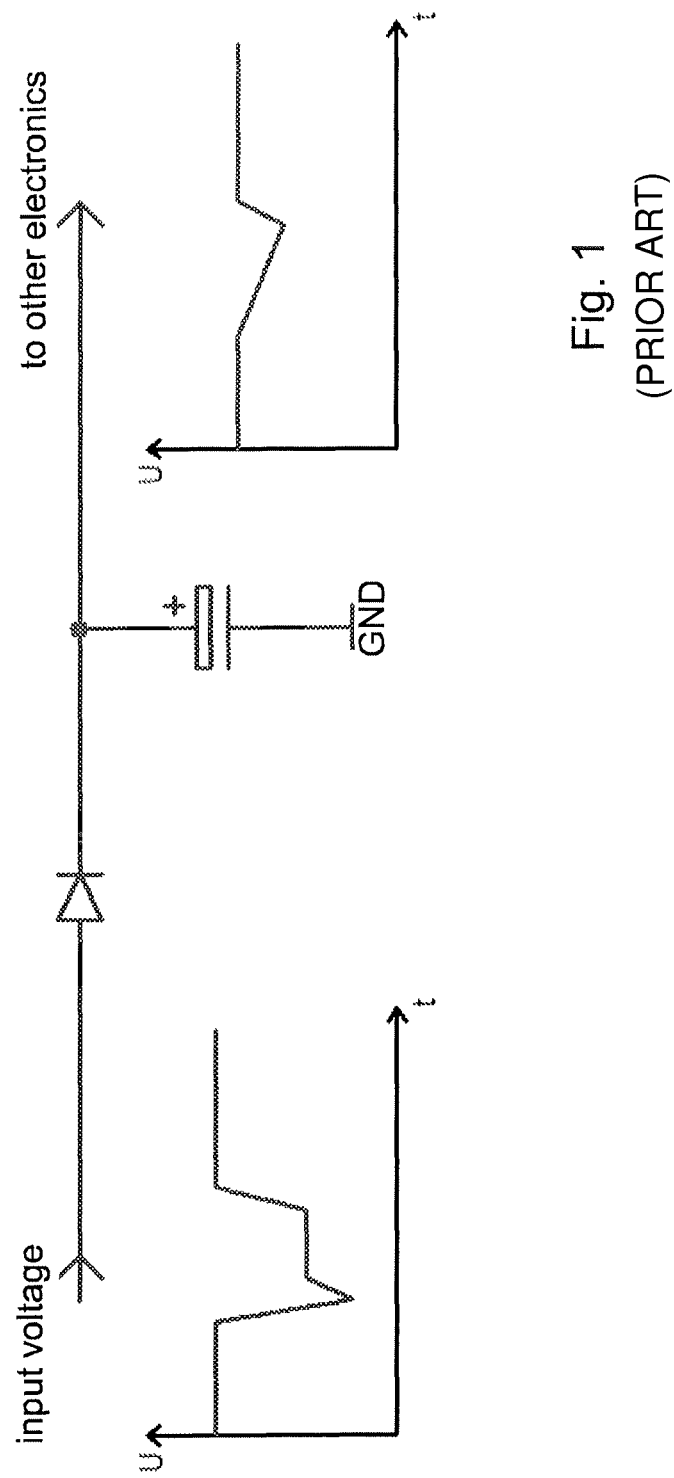

| | | | |
|---|---|---|---|
| 5,539,610 A * | 7/1996 | Williams et al. | 361/246 |
| 5,636,116 A * | 6/1997 | Milavec et al. | 363/89 |
| 6,429,550 B1 | 8/2002 | Braun et al. | |
| 6,469,564 B1 | 10/2002 | Jansen | |
| 2008/0239603 A1* | 10/2008 | Bruce et al. | 361/84 |
| 2009/0212740 A1* | 8/2009 | Felps | 320/134 |

FOREIGN PATENT DOCUMENTS

| | | |
|---|---|---|
| DE | 60133277 T2 | 4/2009 |
| EP | 0626745 A2 | 11/1994 |
| EP | 1401077 A1 | 3/2004 |
| EP | 1420457 A1 | 5/2004 |
| WO | WO 01/86811 A1 | 11/2001 |
| WO | WO 03/052896 A1 | 6/2003 |

* cited by examiner

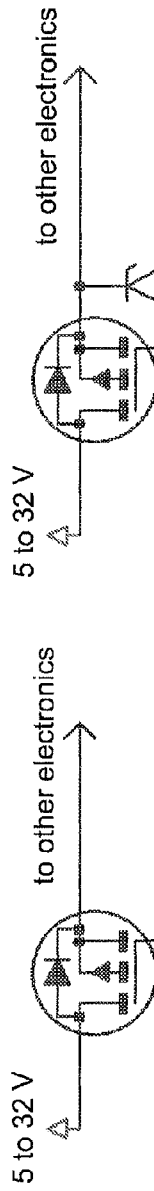
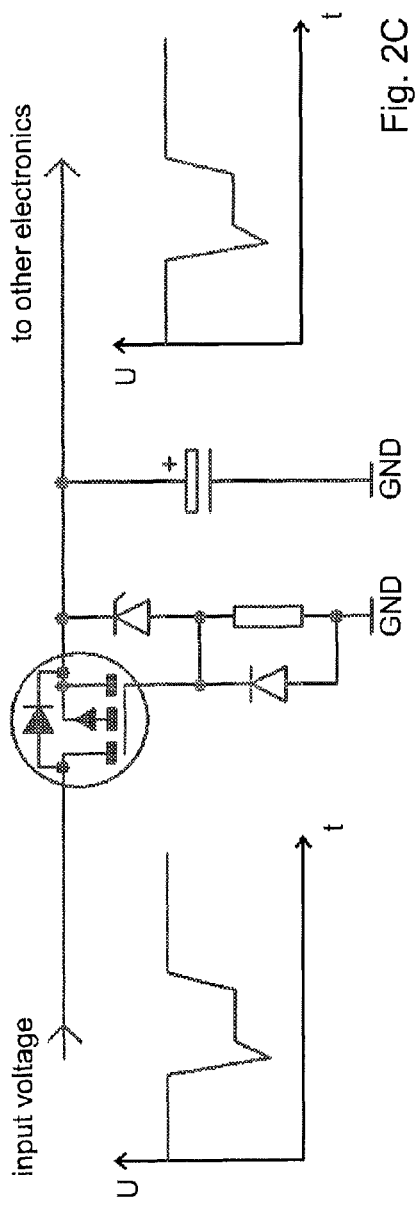
Fig. 2A (PRIOR ART)
Fig. 2B (PRIOR ART)
Fig. 2C (PRIOR ART)

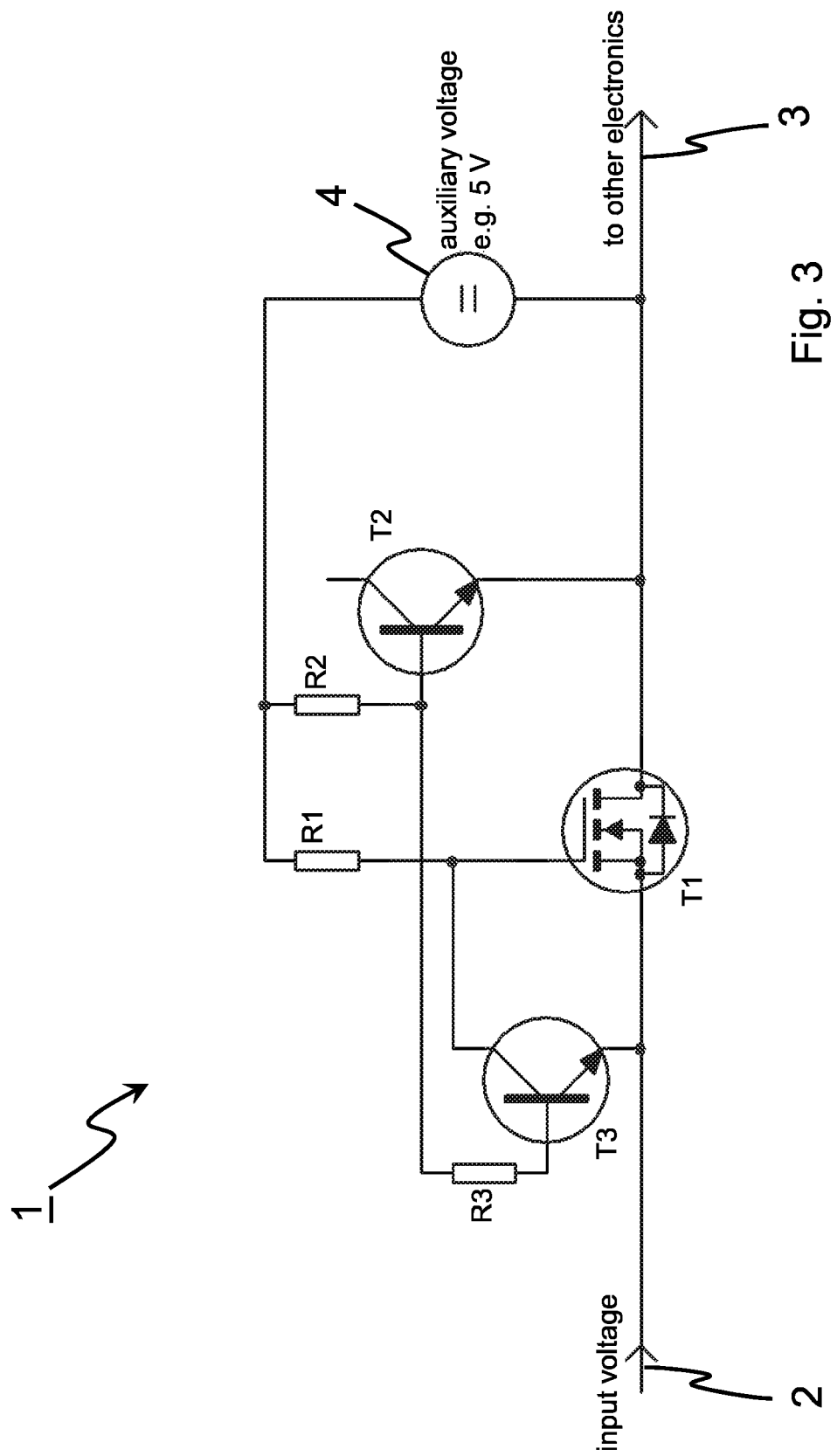

CIRCUIT FOR PROTECTING AGAINST REVERSE POLARITY

CROSS REFERENCE TO RELATED APPLICATIONS

This application is a national stage application, filed under 35 U.S.C. §371, of International Application No. PCT/DE2011/050046, filed Oct. 12, 2011, which claims priority to and the benefit of German Application No. 10 2010 051 874.3, filed Nov. 22, 2010, the contents of both of which are hereby incorporated by reference in their entirety.

BACKGROUND

1. Technical Field

The invention relates to a circuit for the protection of an electrical consumer against polarity reversal, utilizing a MOSFET (metal oxide semiconductor field effect transistor), wherein the circuit is connected to the voltage supply on its input, and to the consumer on its output, and wherein the source terminal of the MOSFET is connected to the voltage supply, and the drain terminal of the MOSFET is connected to the consumer.

2. Description of Related Art

Electrical devices, electrical circuits, or electrical consumers in general which are operated with direct current are typically configured with a special protection for the purpose of protecting the electrical consumer from damage resulting from the reversed connection of the poles of the supply voltage. A diode is frequently used for this purpose. Diodes can be subjected to high currents in the forward direction, and have a high cutoff voltage. In addition, diodes are extremely cheap, such that they have little effect on the total price of the devices.

In addition, a diode in the input circuit has the decisive advantage that it creates a buffer effect together with the capacitors in the device. If the input voltage is suddenly interrupted—for example when the engine in a vehicle is started—the capacitors can maintain the functions of the device for a certain period of time by means of the charge they store. The diodes are used to prevent the charge in the capacitors from discharging in the direction of the power supply. In a vehicle, by way of example, the discharge would occur via external loads such as the starter. The diode therefore enables a certain support effect.

A decisive disadvantage of diodes is that they have a voltage loss in the forward direction of approx. 0.5 to 1 V. This voltage loss has an undesirable effect on the characteristics of the device in two ways. First, the dissipation loss of the device overall increases. As such, at a current of 2 A and 0.5 V, for example, a voltage loss of 1 W occurs in the diode, which itself has a marked effect on the self-heating of the device. Second, the operating voltage must be selected as 0.5 to 1 V higher than is actually necessary, due to the voltage loss via the diode. If the voltage reserve is not properly configured, the voltage drop via the diode can—for example in a vehicle—trigger a reset of a device upon the vehicle starting process.

To reduce the voltage loss, Schottky diodes are sometimes used in protective circuits, wherein only half of the voltage drops in this case compared to standard diodes. However, these diodes have significantly higher leakage current. In addition, the electric strength in the cutoff direction is significantly lower.

In a further protective circuit known from the prior art, MOSFETs (metal oxide semiconductor field effect transistors) are used. MOSFETs offer the advantage that the voltage drop across the transistor is only on the order of magnitude of 0.1 V. If the supply voltage is connected with the poles reversed, the MOSFET closes; if it is connected correctly, the MOSFET conducts current. As a result of the relatively small drop in voltage via the MOSFET, it is possible to greatly reduce the losses. A disadvantage of such protective circuits is that they differ significantly from a diode in their dynamic behavior. MOSFETs conduct current in both directions when connected. As a result, if an interruption occurs in the supply voltage, for example during a starting process in a vehicle, the capacitors in the device discharge via the MOSFET and via external loads. A support effect, as in the use of a diode, does not exist here.

For these reasons, the invention addresses the problem of designing and implementing a protective circuit in the class named above which protects against reverse polarity in such a manner that it is possible to realize a secure protection from reverse polarity, with a dynamic behavior similar to that of a diode, while at the same time having low dissipation loss.

According to the invention, the problem given above is addressed by the features of claim 1. According to the claim, the circuit in question is characterized in that the gate of the MOSFET is connected to the collector of a first bipolar transistor, and the source of the MOSFET is connected to the emitter of the first bipolar transistor, and in that the base of the first bipolar transistor is controlled by means of a control current, wherein the control current is tapped from the voltage at the drain of the MOSFET.

BRIEF SUMMARY

According to the invention, it was initially discovered that it is not necessary to abandon the benefits of the behavior of a diode in applications where a minimal dissipation loss is required in the protective circuit. Rather, it is possible, by a clever combination of a MOSFET and a bipolar transistor, to achieve a protective circuit which comes close to the behavior of an "ideal diode". And ideal diode provides conductance when current is compelled to flow in the direction of flow. In the process, only a negligible drop in voltage occurs across the diode. Ideal diodes close very quickly when the current is compelled to flow in the cut-off direction. This as well can be realized by the protective circuit according to the invention. The gate of the MOSFET is connected to the collector of a first bipolar transistor, and the source of the MOSFET is connected to the emitter of the first bipolar transistor. The base of the first bipolar transistor is controlled by a control current which is tapped from the voltage at the drain of the MOSFET. In this way, it is possible to control the behavior of the MOSFET by means of the voltage between the source and drain of the MOSFET.

During operation of the protective circuit, a voltage is applied at the gate, with the result that the MOSFET is open. When open, the voltage drop across the MOSFET is on the order of magnitude of 0.1 V. During normal operation, the first bipolar transistor is set in such a manner that it cuts off current flow, therefore having no influence on the behavior of the MOSFET. If the voltage at the source of the MOSFET is interrupted, then the emitter of the bipolar transistor is drawn down to a low level, and the bipolar transistor opens. The control voltage at the gate of MOSFET is drawn down, and the gate is discharged. The MOSFET gains higher impedance, and the voltage at the emitter of the bipolar transistor drops further. As a result, the gate is discharged faster and faster, until the MOSFET is completely closed. This can occur in the range of a few microseconds, such that the buffer capacitors are only negligibly discharged when a voltage interruption occurs. In this way, a circuit is created according to the invention which realizes a voltage drop in the range of 0.1 V and below when open, but is also able to completely close when an interruption in the voltage occurs, or when the polarity of the power supply is reversed. The behavior of the circuit according to the invention is relatively near to that of an ideal diode.

A diode is preferably used to tap the control current from the voltage at the drain of the MOSFET. The use of a diode results in well-defined voltage levels, because a nearly constant voltage drop occurs across a diode after the threshold voltage is exceeded, in a wide range.

In one particularly preferred embodiment of the first diode, the same is formed by the base-emitter path of a second bipolar transistor. This is preferably of the same type as the first bipolar transistor. In this way, it is possible to prevent, in a simple manner, a differing behavior of the first and the second bipolar transistors from having a negative influence on the function of the circuit. For further improvement of the configuration, particularly as concerns temperature stability of the circuit, the first and the second bipolar transistors could be placed as closed to each other as possible. For very high demands, further improvements of the configuration can be achieved by using a paired transistor, wherein two identical transistors are accommodated in the same housing. As a result, the response threshold of the first transistor is clearly defined.

For the purpose of further improving the protective circuit, a second diode can be arranged between the emitter and base of the second bipolar transistor. This diode can prevent an excessively high voltage from flowing backward between the emitter and base in the event of a reversal of polarity or an interruption in the voltage supply. If "only" one diode is used to tap the control current for the first bipolar transistor, the second diode could likewise be used, particularly in an antiparallel connection to the first diode.

For the purpose of influencing the drop in voltage across the MOSFET, a resistor can be arranged between the first diode and the drain of the MOSFET. This resistor serves the purpose of influencing the voltage between the gate and drain, and therefore likewise determining the drop in voltage via the source and drain.

In order to protect the gate-source path from excessively high or low voltages, a Zener diode could be arranged parallel to the MOSFET in the direction defined from the source to the gate. In the event that excessive voltage is applied across the Zener diode upon an interruption in the voltage or upon a reversal of polarity, the Zener diode would then conduct and establish a bypass around the MOSFET. The voltage between the gate and source is limited to the level of the breakdown voltage of the Zener diode as a result of this measure.

The wiring of the MOSFET can be supplied by an auxiliary voltage. In one preferred embodiment, the auxiliary voltage is produced by a charge pump. In this case, the auxiliary voltage is preferably generated from the voltage at the drain of the MOSFET. In this way, the configuration ensures a defined voltage difference between the voltage at the drain and the supply voltage of the wiring elements. The auxiliary voltage in this case can be higher than the supply voltage. A preferred auxiliary voltage is 5 V higher than the supply voltage. According to the selection of the wiring elements, however, other voltage levels can also be realized.

In order to improve the switch-on behavior of the protective circuit, a third diode can be arranged parallel to the MOSFET in the direction defined from the source to the drain. This diode can be formed by a diode integrated into the MOSFET; or alternatively or in addition thereto, it would be possible to arrange the third diode outside of the MOSFET. In this manner, the connected consumer is comparatively quickly supplied with power upon the application of an input voltage to the protective circuit. If the auxiliary voltage is generated to supply the wiring elements of the MOSFET from the voltage at the drain of the MOSFET, then no further measures are necessary on the part of the third diode to build up the auxiliary voltage. However, the diode with the relatively high voltage drop only functions during the startup process. After the MOSFET is open, there is a lower voltage drop across the MOSFET, such that the voltage across the third diode is no longer sufficient to set or to maintain the same in a conducting state.

The third diode is preferably formed by a Schottky diode. In this way, the dissipation loss is further reduced during the relatively short startup process.

The MOSFET is preferably operated in the linear region. In this way, the gate does not become saturated, and can be more rapidly evacuated upon interruption of the voltage supply—for example when the MOSFET is switched off. This contributes to an improvement in the dynamic behavior thereof in the event of a malfunction.

DETAILED DESCRIPTION OF THE DRAWINGS

Figure 4:
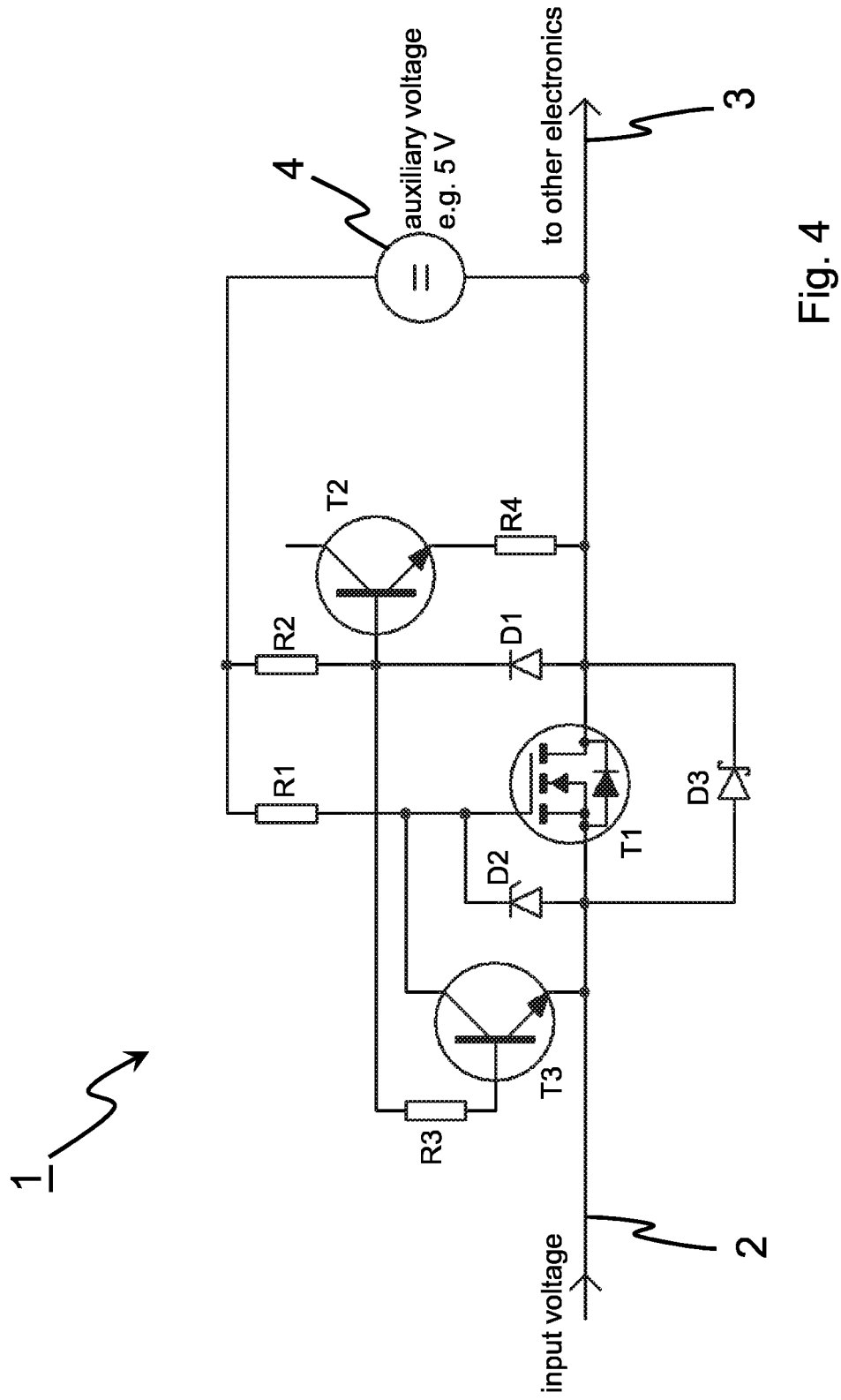
Figure 5:
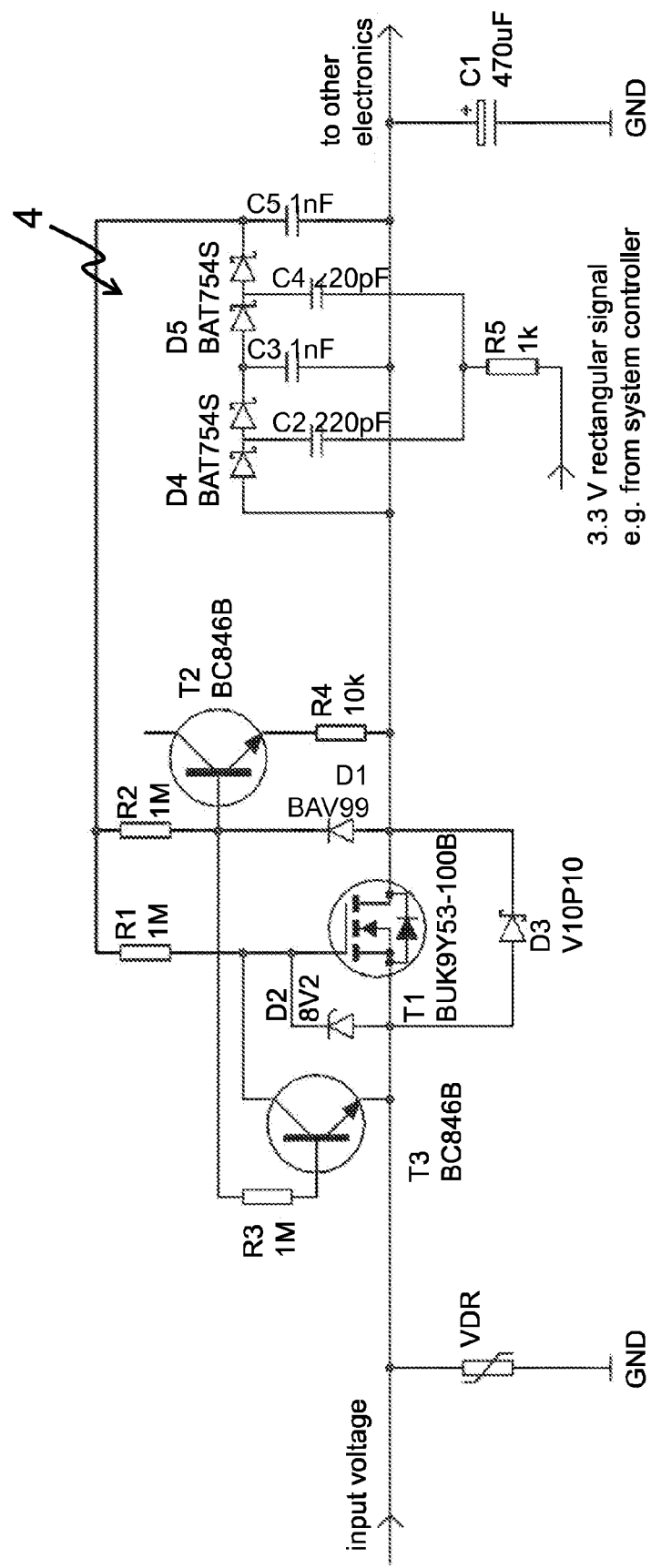

At this point, there are several different options for embodying and implementing the teaching of the present invention in an advantageous manner. To this end, reference is hereby made to the dependent claims following claim 1, as well as to the following explanation of a preferred embodiment of the invention in connection with the drawing. In the context of the explanation of the preferred embodiment of the invention with reference to the drawing, preferred embodiments and implementations of the teaching are also explained in general, wherein:

FIG. 1 shows a protective circuit according to the prior art, having a diode,

FIG. 2 shows three embodiments of protective circuits according to the prior art, using MOSFETs, FIG. 3 shows a first embodiment of a protective circuit according to the invention, FIG. 4 shows a second embodiment of a protective circuit according to the invention, having components to improve the behavior of the circuit, and FIG. 5 shows the second embodiment of a protective circuit according to the invention, having an exemplary selection of components.

DETAILED DESCRIPTION OF VARIOUS EMBODIMENTS

FIGS. 1 and 2 shows protective circuits as known from the prior art. FIG. 1 shows the use of a diode as protection against reversed polarity. The diode connects the voltage source to the further electronics. A capacitor which is connected after the diode between the connection line leading to the further electronics and the ground is sketched as a representative buffer capacitor. If the input voltage undergoes an interruption, for example during a starting process of a vehicle, as illustrated in the lower left portion of the diagram, then the diode prevents the flow of current toward the on-board power supply, and the capacitor can maintain the functions of the further electronics for a certain period of time by means of its stored charge. Without the diode, the capacitor would not have this supportive effect, because external loads—such as the starter, for example—would discharge the capacitor. As a result, the output voltage to the further electronics undergoes a significantly smaller interruption than the input voltage, as can be seen in the diagrams at right and left in FIG. 1.

FIG. 2 shows a further known protective circuit from the prior art. This protective circuit is based on a p-channel MOSFET. In the case of the embodiment according to FIG. 2A, the source is connected to an input voltage, the drain is connected to the further electronics, and the gate is connected to ground. If an input voltage between 5 and 15 V is applied, the MOSFET switches on and the further electronics are supplied with power. If the supply connection has reversed polarity—that is, if the input voltage is <0 V, the MOSFET does not open, such that protection is ensured against connections with reversed polarity. The circuit according to FIG. 2B shows a further embodiment, wherein the configuration contains elements for the protection of the MOSFET.

The illustrated circuits have the disadvantage that they differ significantly in their dynamic behavior from that of a diode. A MOSFET conducts current in both directions when open. As a result, internal buffer capacitors in the device are discharged upon an interruption in the power supply—for example when a vehicle is started. This is clarified in FIG. 2C. The protective circuit in FIG. 2B is connected to a buffer capacitor which is connected between the connection line to the further electronics and the ground. If the input voltage undergoes an interruption, as can be seen at the left below the input of the protective circuit, then a current flows across the MOSFET toward the on-board power supply and the input of the protective circuit. The capacitor is discharged via external loads—for example the starter. As a result, the output voltage of the protective circuit is nearly fully influenced by the input voltage interruption.

The disadvantage of the high drop in voltage across the diode, and the disadvantage of the poor dynamic behavior of a MOSFET protective circuit during a voltage interruption, are both efficaciously addressed by the circuit according to the invention. FIGS. 3 to 5 show various embodiments of a protective circuit according to the invention.

FIG. 3 shows a basic circuit of a protective circuit 1 according to the invention, for the protection of a consumer against reversed polarity. A voltage source can be connected to the input 2. The output 3 of the protective circuit 1 can be connected to a further electronic device, or in general to an electrical consumer. A MOSFET T1 is connected between the input 2 and output 3, wherein the source is connected to the input 2, and the drain is connected to the output 3. The gate of the MOSFET T1 is connected to the collector of a first bipolar transistor T3. The emitter of the first bipolar transistor T3 is connected to the source of the MOSFET T1. The base of the first bipolar transistor T3 is connected to the base of a second bipolar transistor T2 via a resistor R3. The emitter of the second bipolar transistor T2 is connected to the drain of the MOSFET T1. The collector of the second bipolar transistor is not connected; only the base-emitter path of the second bipolar transistor is used. The base-emitter path functions as a first diode which is included for the purpose of tapping the control current for the first bipolar transistor T3 from the voltage at the drain of the MOSFET.

In addition, an auxiliary voltage source 4 is included at the drain of the MOSFET T1, as illustrated in a general manner in FIG. 3 by the circuit diagram symbol for a voltage source. In the illustrated embodiment, the auxiliary voltage source 4 generates a voltage of 5 V, which is added to the voltage at the drain of the MOSFET T1. The auxiliary voltage is connected via a resistor R1 to the gate of the MOSFET T1. A further resistor R2 is connected to the base of the second bipolar transistor T2. A diode is connected inside the housing of the MOSFET T1 in the direction defined from the source to the drain, and functions as a diode in the manner of the third diode according to the dependent claims.

As an explanation of the functionality of the circuit according to the invention, it is hereby initially assumed that the protective circuit 1 is not supplied at this point with voltage at the input. In addition, it is also assumed that the auxiliary voltage source 4 is generated by a charge pump. The input 2 of the protective circuit 1 is connected at this point with a voltage source, which is not included in the drawing. As such, the diode in the MOSFET serves as protection against reversed polarity, although at this point the voltage drop across the protective circuit is still relatively high. A voltage which is suitable for supplying the further electronics is available relatively quickly at the output 3 of the protective circuit 1. The auxiliary voltage is generated by the charge pump, and serves to supply the wiring components consisting of the resistors R1, R2, and R3, as well as the first and the second bipolar transistors T3 and T2. The gate of the MOSFET is charged via the resistor R1, and the MOSFET begins to conduct. As a result, the voltage drop is reduced from approx. 0.8 V immediately after the application of the voltage source to the input 2 of the protective circuit 1 to less than approx. 50 mV. A voltage which is approx. 0.65 V higher than the voltage at the drain of the MOSFET is established on the basis of the second bipolar transistor T2, through the base-emitter path and the resistor R2. In this state—meaning where the voltage at the source of the MOSFET is approx. 50 mV larger than at the drain of the MOSFET—no current flows through the base-emitter path of the first bipolar transistor T3, and T3 closes. This state can be termed normal, error-free operation.

If the voltage at the source of the MOSFET is not approx. 50 mV larger than at the drain of the output (drain), then a current flows through the base-emitter path of the first bipolar transistor T3. As a result, the first bipolar transistor T3 discharges the gate of the MOSFET T1 until the voltage drop between the source and the drain is once again approx. 50 mV. In this manner, the MOSFET can be maintained in linear operation, and it generates a voltage drops of approx. 50 mV, independently from the load current.

In the event of an interruption of the supply voltage, the current flows in the opposite direction, through the MOSFET—meaning from the output 3 of the protective circuit 1 towards the input 2. The voltage at the emitter of the first bipolar transistor T3 drops, and as a result, the first bipolar transistor T3 becomes conductive, and the gate of the MOSFET T1 discharges. As a result, the MOSFET gains in impedance, and the voltage at the emitter of the first bipolar transistor T3 thereby drops further, and the first bipolar transistor discharges the gate faster and faster until the complete closure of the MOSFET T1. While the MOSFET is held in the linear operation region in normal operation by the illustrated circuitry, the gate can be discharged in the range of several microseconds, and the protective circuit 1 can thereby close very quickly. As a result, upon an interruption of the supply voltage at the input 2 of the protective circuit 1, a current is only driven in the opposite direction for a very short period of time, and the buffer capacitors of the further electronics are only discharged to a negligible degree.

FIG. 4 shows a basic circuit as in FIG. 3, complemented by further circuitry elements. A resistor R4 is connected in series between the drain of the MOSFET T1 and the emitter of the second bipolar transistor T2. By means of the resistor R4, it is possible to determine to a large degree how large the drop in voltage is across the MOSFET during normal operation. R4 forms, together with R2, a voltage divider where a voltage drop is produced according to the auxiliary voltage at R4. This voltage drop can be, for example, 50 mV. In this example, the voltage between the source and drain would be controlled to achieve a voltage drop of approx. 0.1 V. As a result, the circuit demonstrates a defined behavior when temperature variations occur, and with respect to the given tolerances of components.

The selection of the n-channel MOSFET T1 used should incorporate considerations that it possess a sufficient voltage strength for the given application. At the same time, it is recommended that a MOSFET be selected which has the least possible gate-drain capacitance, if the shortest possible delay time for closing the transistor is desired. In addition, if possible, the resistance $R_{ds(on)}$ of the MOSFET in the open state should be so low that less than 0.1 V of voltage drop would occur at the highest current draw of the subsequent circuit. If this is not implemented, the MOSFET would be completely turned on, and it would produce a significantly longer delay time to close the transistor upon a drop in voltage.

A Zener diode D2 is connected between the source and gate of the MOSFET T1. As a result, the gate-source path of the MOSFET is protected from voltages which are too high or too low. This occurs, for example, if the auxiliary voltage is significantly lower than the input voltage, for any given reason.

A further diode is connected between the source and drain of the MOSFET. This diode D3 is a Schottky diode which only has half as large a voltage drop compared to a standard diode. As a result, the voltage drop is further reduced immediately following the startup of the protective circuit. The Schottky diode takes over the function of the third diode according to the dependent claims.

The individual measures used here as additional measures need not necessary be incorporated together with the basic circuit. Rather, it is sufficient to include, or leave out, individual diodes or the resistor R4, according to the desired effects.

FIG. 5 shows a circuit, wherein the protective circuit according to the invention can be implemented concretely by said circuit. A varistor VDR is additionally attached at the input 2 of the protective circuit, by means of which it is possible to limit the input voltage to values which are sure to not destroy the MOSFET. In addition, a capacitor C1 is attached at the output 3, by means of which it is possible to buffer the circuit from interruptions in the supply voltage. In addition, the capacitor also helps to realize the shortest possible delay time for the closing of the transistor. It is hereby noted that additional protective elements can be included as well.

In the center region of FIG. 5, the protective circuit according to FIG. 4 is included in the drawing. The resistors R1, R2 and R3 are each selected to have 1 MΩ; the resistor R4 is 10 kΩ. The MOSFET T1 is formed by a BUK9Y53-100B. The first and the second bipolar transistors are BC846Bs. The second diode D1 is a BAV99, the Zener diode D2 is an 8V2, and the Schottky diode D3 is a V10P10. A charge pump is illustrated in the right region of the circuit, and the auxiliary voltage is generated is generated by this charge pump. The charge pump is fed with a rectangular signal at 3.3 V. The rectangular signal can be generated by a microcontroller, by way of example. In the first stage having the double diode D4 and the capacitors C2 and C3, a voltage is generated which is approx. 2.5 V higher than the supply voltage. In the second stage having the double diode D5 and the capacitors C4 and C5, a further increase of 2.5 V is created, such that a voltage is formed which is 5 V higher than the supply voltage, and which is well-suited for controlling the MOSFET. The resistor R5 at the connection point of the rectangular signal limits the height of the current pulses. The control voltage for the charge pump can also be generated in another manner. In addition, the control voltage can also be used for further circuit components and other circuits.

As concerns further advantageous embodiments of the device according to the invention, reference is hereby made to the general part of the description, as well as to the attached claims, to avoid repetitions.

Finally, it is hereby expressly stated that the embodiments of the circuit according to the invention described above serve only to explicate the claimed teaching, and said teaching is not restricted to the embodiments.

LIST OF REFERENCE NUMBERS 1 protective circuit
2 input
3 output
4 auxiliary voltage source
T1 MOSFET
T3 first bipolar transistor
T2 second bipolar transistor
D1 second diode
D2 Zener diode
D3 third diode

The invention claimed is:
1. A circuit for the protection of an electrical consumer against polarity reversal, said circuit comprising:
   a metal oxide semiconductor field effect transistor (MOSFET) (T1);
   a first diode;
   a second diode; and
   a resistor (R4) arranged between the first diode and a drain of the MOSFET (T1),
   wherein:
      the circuit is connected to a voltage supply on its input, and to the consumer on its output;
      the source terminal of the MOSFET (T1) is connected to the voltage supply;
      the drain terminal of the MOSFET (T1) is connected to the consumer;
      the gate of the MOSFET (T1) is connected to the collector of a first bipolar transistor (T3);
      the source of the MOSFET (T1) is connected to the emitter of the first bipolar transistor (T3);
      the base of the first bipolar transistor (T3) is controlled by means of a control current;
      the control current is derived from the voltage at the drain of the MOSFET (T1);
      the first diode is configured for tapping the control current from the voltage of the drain of the MOSFET (T1);
      the resistor (R4) is configured to control the voltage drop across the MOSFET (T1); and
      the MOSFET (T1) is an n-channel enhancement MOSFET;
      the first diode is formed by the base-emitter path of a second bipolar transistor (T2); the second diode is arranged between the emitter and the base of the second bipolar transistor (T2); and
      the second diode being configured to prevent an excessively high voltage flowing backward between the emitter and the base in the event of a reversal in polarity or of an interruption in the supply voltage.
2. A circuit according to claim 1, further comprising a Zener diode (D2) arranged parallel to the MOSFET in the direction defined from the source to the gate, said Zener diode

(D2) being configured to protect the gate-source path from excessively high and low voltages.

3. A circuit according to claim 1, wherein the circuitry of the MOSFET is supplied by an auxiliary voltage.

4. A circuit according to claim 3, wherein the auxiliary voltage is generated by a charge pump.

5. A circuit according to claim 3, wherein the auxiliary voltage is generated from the voltage at the drain of the MOSFET.

6. A circuit according to claim 3, wherein the auxiliary voltage is higher than the supply voltage.

7. A circuit according to claim 6, wherein the auxiliary voltage is 5 V higher than the supply voltage.

8. A circuit according to claim 1, further comprising a third diode arranged parallel to the MOSFET in the direction defined from the source to the drain, wherein the third diode serves as protection against reversed polarity as long as the MOSFET has not yet been switched on, and wherein the third diode is formed by a Schottky diode.

9. A circuit according to claim 1, wherein the MOSFET (T1) is connected in such a manner that it is operated in the linear region.

\* \* \* \* \*